United States Patent
Dancho et al.

(10) Patent No.: US 9,442,662 B2
(45) Date of Patent: Sep. 13, 2016

(54) DEVICE AND METHOD FOR MANAGING DIE GROUPS

(71) Applicant: SanDisk Enterprise IP LLC, Milpitas, CA (US)

(72) Inventors: Mark Dancho, Chandler, AZ (US); James Fitzpatrick, Sudbury, MA (US); Li Li, Wellesley, MA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/137,511

(22) Filed: Dec. 20, 2013

(65) Prior Publication Data

US 2015/0113203 A1    Apr. 23, 2015

Related U.S. Application Data

(60) Provisional application No. 61/893,104, filed on Oct. 18, 2013.

(51) Int. Cl.
*G06F 12/02* (2006.01)
*G11C 16/34* (2006.01)
(Continued)

(52) U.S. Cl.
CPC ............ *G06F 3/0616* (2013.01); *G06F 3/0653* (2013.01); *G06F 3/0679* (2013.01); *G06F 12/0246* (2013.01); *G11C 11/5628* (2013.01); *G11C 16/0483* (2013.01); *G11C 16/3495* (2013.01); *G06F 2212/7211* (2013.01)

(58) Field of Classification Search
CPC .......... G11C 16/2495; G11C 16/0483; G11C 11/5628; G06F 12/0246; G06F 2212/7211
See application file for complete search history.

(56) References Cited

U.S. PATENT DOCUMENTS

| 4,173,737 A | 11/1979 | Skerlos et al. |
| 4,888,750 A | 12/1989 | Kryder et al. |

(Continued)

FOREIGN PATENT DOCUMENTS

| EP | 1 299 800 | 4/2003 |
| EP | 1465203 A1 | 10/2004 |

(Continued)

OTHER PUBLICATIONS

International Search Report and Written Opinion dated Jan. 21, 2015, received in International Application No. PCT/US2014/059748, which corresponding to U.S. Appl. No. 14/137,511, 13 pages (Dancho).

(Continued)

*Primary Examiner* — Edward Dudek, Jr.
(74) *Attorney, Agent, or Firm* — Morgan, Lewis & Bockius LLP

(57) ABSTRACT

The embodiments described herein methods and devices that enhance the endurance of a non-volatile memory (e.g., flash memory). The method includes obtaining, for each of the plurality of die, an endurance metric. The method also includes sorting the plurality of die into a plurality of die groups based on their corresponding endurance metrics, where each die group includes one or more die and each die group is associated with a range of endurance metrics. In response to a write command specifying a set of write data, the method further includes writing the write data to the non-volatile memory by writing in parallel subsets of the write data to the one or more die assigned to a single die group of the plurality of die groups.

23 Claims, 8 Drawing Sheets

(51) Int. Cl.
  *G06F 3/06* (2006.01)
  *G11C 11/56* (2006.01)
  *G11C 16/04* (2006.01)

(56) References Cited

U.S. PATENT DOCUMENTS

| | | | |
|---|---|---|---|
| 4,916,652 A | 4/1990 | Schwarz et al. |
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,404,485 A | 4/1995 | Ban |
| 5,488,702 A | 1/1996 | Byers et al. |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,930,188 A | 7/1999 | Roohparvar |
| 5,936,884 A | 8/1999 | Hasbun et al. |
| 5,943,692 A | 8/1999 | Marberg et al. |
| 5,946,714 A | 8/1999 | Miyauchi |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,260,120 B1 | 7/2001 | Blumenau et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,647,387 B1 | 11/2003 | McKean et al. |
| 6,678,788 B1 | 1/2004 | O'Connell |
| 6,728,879 B1 | 4/2004 | Atkinson |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,024,514 B2 | 4/2006 | Mukaida et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,155,579 B1 | 12/2006 | Neils et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,212,440 B2 | 5/2007 | Gorobets |
| 7,275,170 B2 | 9/2007 | Suzuki |
| 7,295,479 B2 | 11/2007 | Yoon et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,669,003 B2 | 2/2010 | Sinclair et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot et al. |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,554,984 B2 | 10/2013 | Yano et al. |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,832,384 B1 | 9/2014 | de la Iglesia |
| 8,885,434 B2 | 11/2014 | Kumar |
| 8,898,373 B1 | 11/2014 | Kang et al. |
| 8,909,894 B1 | 12/2014 | Singh et al. |
| 8,910,030 B2 | 12/2014 | Goel |
| 8,923,066 B1 | 12/2014 | Subramanian et al. |
| 9,043,517 B1 | 5/2015 | Sprouse et al. |
| 9,128,690 B2 | 9/2015 | Lotzenburger et al. |
| 9,329,789 B1 | 5/2016 | Chu et al. |
| 2001/0026949 A1 | 10/2001 | Ogawa et al. |
| 2001/0050824 A1 | 12/2001 | Buch |
| 2002/0024846 A1 | 2/2002 | Kawahara et al. |
| 2002/0032891 A1 | 3/2002 | Yada et al. |
| 2002/0036515 A1 | 3/2002 | Eldridge et al. |
| 2002/0083299 A1 | 6/2002 | Van Huben et al. |
| 2002/0099904 A1 | 7/2002 | Conley |
| 2002/0116651 A1 | 8/2002 | Beckert et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |

(56) References Cited

U.S. PATENT DOCUMENTS

| | | |
|---|---|---|
| 2003/0043829 A1 | 3/2003 | Rashid et al. |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2003/0225961 A1 | 12/2003 | Chow et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0085849 A1 | 5/2004 | Myoung et al. |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0158775 A1 | 8/2004 | Shibuya et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0210706 A1 | 10/2004 | In et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1 | 6/2005 | Keller, Jr. et al. |
| 2005/0144358 A1 | 6/2005 | Conley et al. |
| 2005/0144361 A1 | 6/2005 | Gonzalez et al. |
| 2005/0144367 A1 | 6/2005 | Sinclair |
| 2005/0144516 A1 | 6/2005 | Gonzalez et al. |
| 2005/0154825 A1 | 7/2005 | Fair |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0210348 A1 | 9/2005 | Totsuka |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0281088 A1 | 12/2005 | Ishidoshiro et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1 | 5/2006 | Moon et al. |
| 2006/0107181 A1 | 5/2006 | Dave et al. |
| 2006/0136570 A1 | 6/2006 | Pandya |
| 2006/0136655 A1 | 6/2006 | Gorobets et al. |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0224841 A1 | 10/2006 | Terai et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0101096 A1 | 5/2007 | Gorobets |
| 2007/0106679 A1 | 5/2007 | Perrin et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0191993 A1 | 8/2007 | Wyatt |
| 2007/0201274 A1 | 8/2007 | Yu et al. |
| 2007/0204128 A1 | 8/2007 | Lee et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwell et al. |
| 2007/0268754 A1 | 11/2007 | Lee et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0052451 A1 | 2/2008 | Pua et al. |
| 2008/0056005 A1 | 3/2008 | Aritome |
| 2008/0059602 A1 | 3/2008 | Matsuda et al. |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0209282 A1 | 8/2008 | Lee et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003046 A1 | 1/2009 | Nirschl et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |

(56) References Cited

U.S. PATENT DOCUMENTS

| | | |
|---|---|---|
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0185807 A1 | 7/2010 | Meng et al. |
| 2010/0199027 A1 | 8/2010 | Pucheral et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0257379 A1 | 10/2010 | Wang et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2010/0332863 A1 | 12/2010 | Johnston |
| 2011/0010514 A1 | 1/2011 | Benhase et al. |
| 2011/0022779 A1 | 1/2011 | Lund et al. |
| 2011/0022819 A1 | 1/2011 | Post et al. |
| 2011/0051513 A1 | 3/2011 | Shen et al. |
| 2011/0066597 A1 | 3/2011 | Mashtizadeh et al. |
| 2011/0066806 A1 | 3/2011 | Chhugani et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2011/0320733 A1 | 12/2011 | Sanford et al. |
| 2012/0011393 A1 | 1/2012 | Roberts et al. |
| 2012/0017053 A1* | 1/2012 | Yang .................. G06F 12/0246 711/154 |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1 | 5/2012 | Kolvick et al. |
| 2012/0124273 A1 | 5/2012 | Goss et al. |
| 2012/0131286 A1 | 5/2012 | Faith et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1* | 9/2012 | Ryan .................. G11C 11/5628 711/103 |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1* | 2/2013 | Cordero .................. G06F 1/10 327/524 |
| 2013/0047045 A1 | 2/2013 | Hu et al. |
| 2013/0070527 A1 | 3/2013 | Sabbag et al. |
| 2013/0073798 A1 | 3/2013 | Kang et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124792 A1 | 5/2013 | Melik-Martirosian et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1* | 9/2013 | Zhong et al. .................. 711/102 |
| 2013/0238576 A1 | 9/2013 | Binkert et al. |
| 2013/0254498 A1 | 9/2013 | Adachi et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0297613 A1 | 11/2013 | Yu |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2013/0346672 A1 | 12/2013 | Sengupta et al. |
| 2014/0013027 A1 | 1/2014 | Jannyavula et al. |
| 2014/0013188 A1 | 1/2014 | Wu et al. |
| 2014/0025864 A1 | 1/2014 | Zhang et al. |
| 2014/0032890 A1 | 1/2014 | Lee et al. |
| 2014/0063905 A1 | 3/2014 | Ahn et al. |
| 2014/0067761 A1 | 3/2014 | Chakrabarti et al. |
| 2014/0075133 A1 | 3/2014 | Li et al. |
| 2014/0082261 A1 | 3/2014 | Cohen et al. |
| 2014/0082310 A1 | 3/2014 | Nakajima |

(56) References Cited

U.S. PATENT DOCUMENTS

| | | |
|---|---|---|
| 2014/0082456 A1 | 3/2014 | Liu |
| 2014/0095775 A1 | 4/2014 | Talagala et al. |
| 2014/0101389 A1 | 4/2014 | Nellans et al. |
| 2014/0115238 A1 | 4/2014 | Xi et al. |
| 2014/0122818 A1 | 5/2014 | Hayasaka et al. |
| 2014/0122907 A1 | 5/2014 | Johnston |
| 2014/0136762 A1 | 5/2014 | Li et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0157065 A1 | 6/2014 | Ong |
| 2014/0181458 A1 | 6/2014 | Loh et al. |
| 2014/0201596 A1 | 7/2014 | Baum et al. |
| 2014/0223084 A1 | 8/2014 | Lee et al. |
| 2014/0244578 A1 | 8/2014 | Winkelstraeter |
| 2014/0258755 A1 | 9/2014 | Stenfort |
| 2014/0269090 A1 | 9/2014 | Flynn et al. |
| 2014/0310494 A1 | 10/2014 | Higgins et al. |
| 2014/0359381 A1 | 12/2014 | Takeuchi et al. |
| 2015/0023097 A1 | 1/2015 | Khoueir et al. |
| 2015/0037624 A1 | 2/2015 | Thompson et al. |
| 2015/0153799 A1 | 6/2015 | Lucas et al. |
| 2015/0153802 A1 | 6/2015 | Lucas et al. |
| 2015/0212943 A1 | 7/2015 | Yang et al. |
| 2015/0268879 A1 | 9/2015 | Chu |

FOREIGN PATENT DOCUMENTS

| | | |
|---|---|---|
| EP | EP 1 990 921 A2 | 11/2008 |
| EP | 2 386 958 A1 | 11/2011 |
| EP | 2 620 946 A2 | 7/2013 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

International Search Report and Written Opinion dated Feb. 18, 2015, received in International Application No. PCT/US2014/066921, which corresponding to U.S. Appl. No. 14/135,260, 13 pages (Fitzpatrick).
Ashkenazi at al., "Platform independent overall security architecture in multi-processor system-on-chip integrated circuits for use in mobile phones and handheld devices," ScienceDirect, Computers and Electrical Engineering 33 (2007); 18 pages.
Lee et al., "A Semi-Preemptive Garbage Collector for Solid State Drives," Apr. 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in International Patent Application No. PCT/US2014/085987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/136,433, 21 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Barr, Introduction to Watchdog Timers, Oct. 2001, 3 pgs.
Canim, Buffered Bloom ilters on Solid State Storage, ADMS*10, Singapore, 13-17SEP2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, 27OCT2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.

(56) References Cited

OTHER PUBLICATIONS

SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Invitation to Pay Additional Fees dated Feb. 13, 2014, received in International Patent Application No. PCT/US2014/063949, which corresponds to U.S. Appl. No. 14/135,433, 6 pages (Delpapa).
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Sep. 14, 2015, received in International Patent Application No. PCT/US2015/036807, which corresponds to U.S. Appl. No. 14/311,152, 9 pages (Higgins).
Bayer, "Prefix B-Trees", IP.COM Journal, IP.COM Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
International Search Report and Written Opinion dated Jun. 30, 2015, received in International Patent Application No. PCT/US2015/023927, which corresponds to U.S. Appl. No. 14/454,687, 11 pages (Kadayam).
International Search Report and Written Opinion dated Jul. 23, 2015, received in International Patent Application No. PCT/US2015/030850, which corresponds to U.S. Appl. No. 14/298,843, 12 pages (Ellis).
IBM Research-Zurich, "The Fundamental Limit of Flash Random Write Performance: Understanding, Analysis and Performance Modeling," Mar. 31, 2010, pp. 1-15.
Gasior, "Gigabyte's i-Ram storage device, Ram disk without the fuss," The Tech Report, p. 1, Jan. 25, 2006, 5 pages.
Oestreicher et al., "Object Lifetimes in Java Card," 1999, USENIX, 10 pages.
International Preliminary Report on Patentability dated May 24, 2016, received in International Patent Application No. PCT/US2014/065987, which corresponds to U.S. Appl. No. 14/135,400, 9 pages (George).

\* cited by examiner

| | Channel 0 | Channel 1 | Channel 2 | ... | Channel 14 | Channel 15 | |
|---|---|---|---|---|---|---|---|
| Rank 1 | Die 3 | Die 2 | Die 0 | ... | Die 7 | Die 6 | ⎫ Die Group 0 |
| Rank 2 | Die 7 | Die 6 | Die 2 | ... | Die 1 | Die 0 | ⎭ |
| Rank 3 | Die 0 | Die 3 | Die 7 | ... | Die 5 | Die 3 | ⎫ Die Group 1 |
| Rank 4 | Die 1 | Die 1 | Die 6 | ... | Die 0 | Die 7 | ⎭ |
| Rank 5 | Die 5 | Die 7 | Die 4 | ... | Die 6 | Die 5 | ⎫ Die Group 2 |
| Rank 6 | Die 4 | Die 0 | Die 5 | ... | Die 3 | Die 2 | ⎭ |
| Rank 7 | Die 2 | Die 4 | Die 1 | ... | Die 2 | Die 4 | ⎫ Die Group 3 |
| Rank 8 | Die 6 | Die 5 | Die 3 | ... | Die 4 | Die 1 | ⎭ |

Figure 4

DEVICE AND METHOD FOR MANAGING DIE GROUPS

RELATED APPLICATIONS

This application claims priority to U.S. Provisional Patent Application No. 61/893,104, filed Oct. 18, 2013, which is hereby incorporated by reference in its entirety.

TECHNICAL FIELD

The disclosed embodiments relate generally to memory systems, and in particular, to improving the endurance of a storage medium, such as flash memory.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

Generally, non-volatile memory devices, such as flash memory devices, include a plurality die. The amount of program-erase (PE) cycles that the plurality of die within a same non-volatile memory device can sustain before being considered operationally defunct varies significantly (e.g., by a factor of three). As such, a non-volatile memory device's endurance is, typically, only as robust as its weakest die. Thus, a method for managing the varying endurance capabilities of die within a non-volatile memory device is desired.

SUMMARY

The disclosed device and method improves the endurance of non-volatile memory. An endurance metric for each die of a non-volatile memory is obtained. The die are logically grouped in die groups based on their corresponding endurance metric. Thereafter, memory operations are performed on a single die group, where the die group includes a plurality of die with similar endurance metrics.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 4 is a block diagram of a plurality of die groups in accordance with some embodiments.

Figure 1:
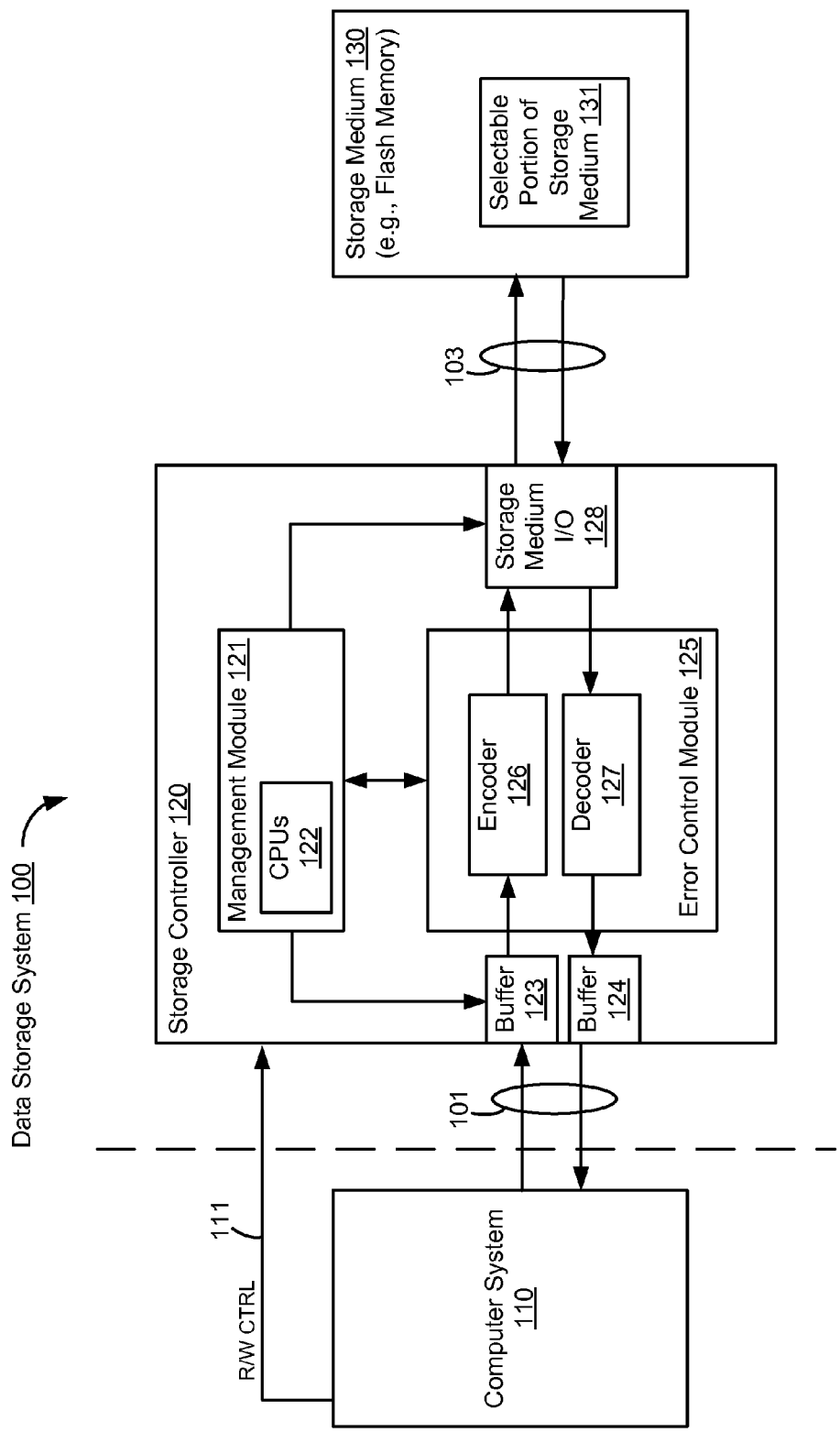
FIG. 1 is a block diagram illustrating an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include devices and/or methods that may improve the endurance of a storage medium, such as a flash memory. Some embodiments include devices and/or methods for managing a storage system by grouping die with similar endurance metrics into die groups.

Some embodiments include a method of managing a storage system that comprises a storage controller and non-volatile memory (e.g., flash memory), the non-volatile memory comprising a plurality of die and each die comprising a plurality of blocks (sometimes also herein called subunits). In some embodiments, the method is performed at the storage controller. The method includes obtaining, for each of the plurality of die, an endurance metric. The method also includes sorting the plurality of die into a plurality of die groups based on their corresponding endurance metrics, where each die group includes one or more die and each die group is associated with a range of endurance metrics. In response to a write command specifying a set of write data, the method further includes writing the write data to the non-volatile memory by writing in parallel subsets of the write data to the one or more die assigned to a single die group of the plurality of die groups.

Some embodiments include a method of managing a storage system that comprises a storage controller and non-volatile memory (e.g., flash memory), the non-volatile memory comprising a plurality of die and each die comprising a plurality of blocks (sometimes also herein called subunits). In some embodiments, the method is performed at the storage controller with a plurality of channels communicatively coupled to the non-volatile memory, where each channel is communicatively coupled with a respective subset of the plurality of die. The method includes: obtaining, for each of the plurality of die, an endurance metric; and, for each channel, ranking the die in the channel in accordance with the endurance metrics of the respective die in the channel. The method also includes: based on the ranking of the die in each of the channels, assigning to each die group of a plurality of die groups, one or more die from each channel, where the die assigned to a respective die group have a rank, or range of ranks, corresponding to the respective die group, and each die group has a distinct corresponding rank or range of ranks. In response to a write command specifying a set of write data, the method further includes writing the write data to the non-volatile memory by writing in parallel subsets of the write data to the plurality of die assigned to a single die group of the plurality of die groups.

Some embodiments include a storage controller comprising: one or more processors; a host interface configured to couple the storage controller to a host; a storage medium interface configured to couple the storage controller to non-volatile memory comprising a plurality of die, each die comprising a plurality of blocks; and a storage controller storing instructions, which when executed by the one or more processors, cause the storage controller to perform the operations of any of the methods described herein.

Some embodiments include a storage controller comprising: a host interface configured to couple the storage controller to a host; a storage medium interface configured to couple the storage controller to non-volatile memory comprising a plurality of die and each die comprising a plurality of blocks; and means for performing the operations of any of the methods described herein.

Some embodiments include a storage system, comprising: a host interface configured to couple the storage system to a host; non-volatile memory comprising a plurality of die, each die comprising a plurality of blocks; and a storage controller with one or more processors and memory storing one or more programs, which when executed by the one or more processors cause the storage system to perform or control performance of any of the methods described herein.

Some embodiments include a non-transitory computer readable storage medium, storing one or more programs for execution by one or more processors of a storage controller communicatively coupled with a non-volatile memory comprising a plurality of die and each die comprising a plurality of blocks, the one or more programs including instructions for performing any of the methods described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a diagram of an implementation of a data storage system 100, in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes a storage controller 120, and a storage medium 130, and is used in conjunction with a computer system 110. In some embodiments, storage medium 130 is a single flash memory device while in other embodiments storage medium 130 includes a plurality of flash memory devices. In some embodiments, storage medium 130 is NAND-type flash memory or NOR-type flash memory. Further, in some embodiments, storage controller 120 is a solid-state drive (SSD) controller. However, other types of storage media may be included in accordance with aspects of a wide variety of embodiments.

Computer system 110 is coupled to storage controller 120 through data connections 101. However, in some embodiments computer system 110 includes storage controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some embodiments, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to storage controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 120 includes a management module 121, an input buffer 123, an output buffer 124, an error control module 125 and a storage medium interface (I/O) 128. Storage controller 120 may include various additional features that have not been illustrated for the sake of brevity and so as not to obscure more pertinent features of the example embodiments disclosed herein, and that a different arrangement of features may be possible. Input and output buffers 123, 124 provide an interface to computer system 110 through data connections 101. Similarly, storage medium I/O 128 provides an interface to storage medium 130 though connections 103. In some embodiments, storage medium I/O 128 includes read and write circuitry, including circuitry capable of providing reading signals to storage medium 130 (e.g., reading threshold voltages for NAND-type flash memory).

In some embodiments, management module 121 includes one or more processing units (CPUs, also sometimes called processors) 122 configured to execute instructions in one or more programs (e.g., in management module 121). In some embodiments, one or more CPUs 122 are shared by one or more components within, and in some cases, beyond the function of storage controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to storage controller 120 requesting data from storage medium 130. Storage controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some embodiments, if the decoding is not successful, storage controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

Figure 2A:
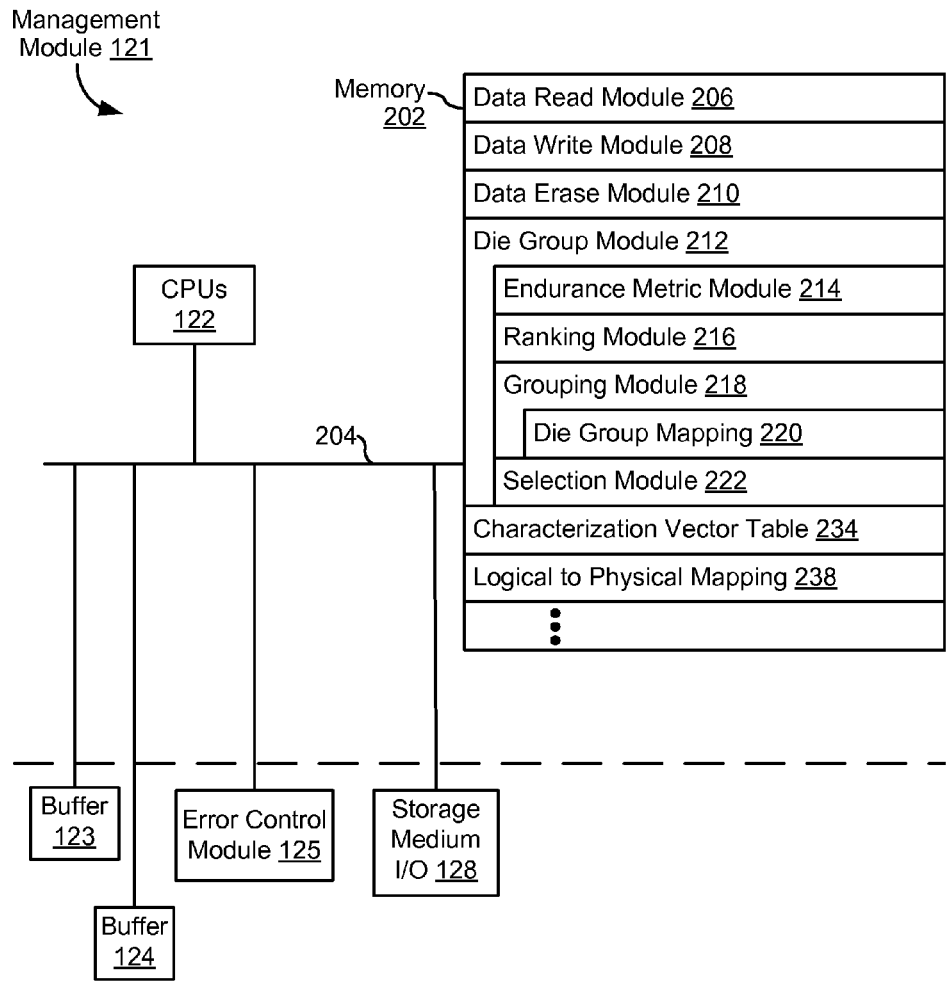
FIG. 2A is a block diagram illustrating an implementation of a management module in accordance with some embodiments.

FIG. 2A is a block diagram illustrating an exemplary management module 121 in accordance with some embodiments. Management module 121 typically includes: one or more processing units (CPUs) 122 for executing modules, programs and/or instructions stored in memory 202 and thereby performing processing operations; memory 202; and one or more communication buses 204 for interconnecting these components. One or more communication buses 204, optionally, include circuitry (sometimes called a chipset) that interconnects and controls communications between system components. Management module 121 is coupled to buffer 123, buffer 124, error control module 125, and storage medium I/O 128 by one or more communication buses 204. Memory 202 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 202, optionally, includes one or more storage devices remotely located from the CPU(s) 122. Memory 202, or alternatively the non-volatile memory device(s) within memory 202, comprises a non-transitory computer readable storage medium. In some embodiments, memory 202, or the non-transitory computer readable storage medium of memory 202, stores the following programs, modules, and data structures, or a subset or superset thereof:

data read module 206 for reading data from storage medium 130 comprising flash memory (e.g., one or more flash memory devices each comprising a plurality of die);

data write module 208 for writing data to storage medium 130;

data erase module 210 for erasing data from storage medium 130;

die group module 212 for dividing storage medium 130 into a plurality of die groups and managing the plurality of die groups, including but not limited to:
  endurance metric module 214 for obtaining an endurance metric for each of the plurality of die;
  ranking module 216 for ranking the plurality of die based on their corresponding endurance metrics;
  grouping module 218 for assigning the plurality of die to die groups based on their corresponding rankings, including die group mapping 220 associating logical addresses of die to a die group; and
  a selection module 222 for selecting a die group for a memory operation;

characterization vector table 234 that includes a collection of characterization vectors 236 each storing characterization data for a respective portion of storage medium 130 (e.g., a flash memory device, die, block zone, block, word line, word line zone or page portion of storage medium 130); and logical to physical mapping 238 associating logical addresses with physical addresses for respective portions of storage medium 130 (e.g., a distinct flash memory device, die, block zone, block, word line, word line zone or page portion of storage medium 130).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 202 may store a subset of the modules and data structures identified above. Furthermore, memory 202 may store additional modules and data structures not described above. In some embodiments, the programs, modules, and data structures stored in memory 202, or the non-transitory computer readable storage medium of memory 202, provide instructions for implementing any of the methods described below with reference to FIGS. 6A-6B.

Although FIG. 2A shows a management module 121, FIG. 2A is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Figure 2B:
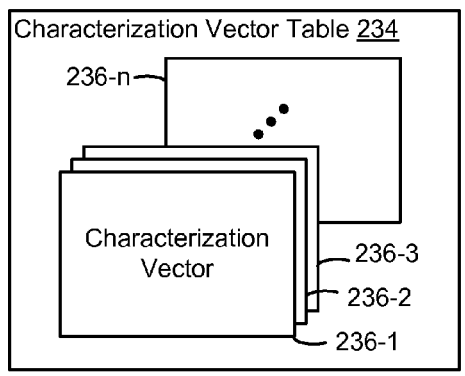
FIG. 2B is a diagram illustrating a characterization vector table included in FIG. 2A in accordance with some embodiments.

FIG. 2B is a block diagram illustrating an implementation of a characterization vector table 234 in accordance with some embodiments. Characterization vector table 234 includes a collection of characterization vectors 236, that each store characterization data associated with a respective portion of a storage medium 130 (e.g., a distinct device, die, block zone, block, word line, word line zone or page portion of storage medium 130). In some embodiments, each vector (e.g., vector 236-1, vector 236-2, . . . , vector 236-n) in the collection of characterization vectors 236 stores characterization data derived during each of at least two time periods (e.g., time T-1 and time T-2, or Xprogram-erase (PE) cycles and 2X PE cycles). In some embodiments, the characterization data stored in characterization vectors 236 is statistically derived. For example, without limitation, in some embodiments in which a storage medium 130 (FIG. 1) (e.g., one or more flash memory devices, each comprising a plurality of die) includes a plurality of die, characterization vector table 234 includes at least one characterization vector for each die. In another example, in some embodiments, characterization vector table 234 includes a set of distinct characterization vectors 236 for each die in storage medium 130, and the set of distinct characterization vectors 236 for each die includes at least one distinct characterization vector for each block in the die. More detailed example embodiments of characterization vectors 236 are described below with reference to FIG. 2C.

Figure 2C:
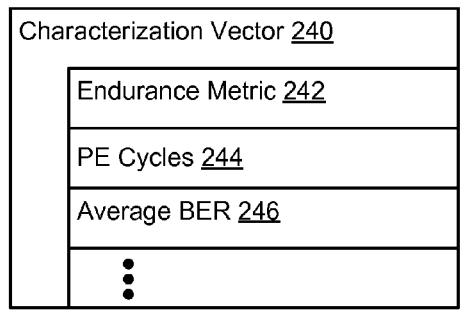
FIG. 2C is a diagram illustrating a characterization vector included in FIG. 2B in accordance with some embodiments.

FIG. 2C is a schematic diagram of an implementation of a characterization vector 240 (e.g., corresponding to one of characterization vectors 236 shown in FIG. 2B) for a respective die of the plurality of die in accordance with some embodiments. In some embodiments, characterization data stored in characterization vector 240 for the respective die includes storage medium characterization parameter values such endurance metric field 242 indicating the endurance capabilities of the respective die (e.g., a number of program-erase (PE) cycles sustained by a representative block within the respective die during a calibration routine), a PE cycles field 244 indicating a current count of the number of PE cycles performed on the respective die, and an average bit error rate (BER) 246 indicating an average BER of one or more blocks within the respective die. In some embodiments, the one or more storage medium characterization parameter values provide an indication of at least one of: a physical characteristic associated with the respective portion the storage medium (e.g., a distinct flash memory device, die, block zone, block, word line, word line zone or page portion of storage medium 130, FIG. 1), a mode of operation associated with the respective portion of the storage medium, a history of use associated with the respective portion of the storage medium, a condition characteristic associated with the respective portion of the storage medium, a read type associated with the respective portion of the storage medium, and location(s) associated with the respective portion of the storage medium.

Figure 3:
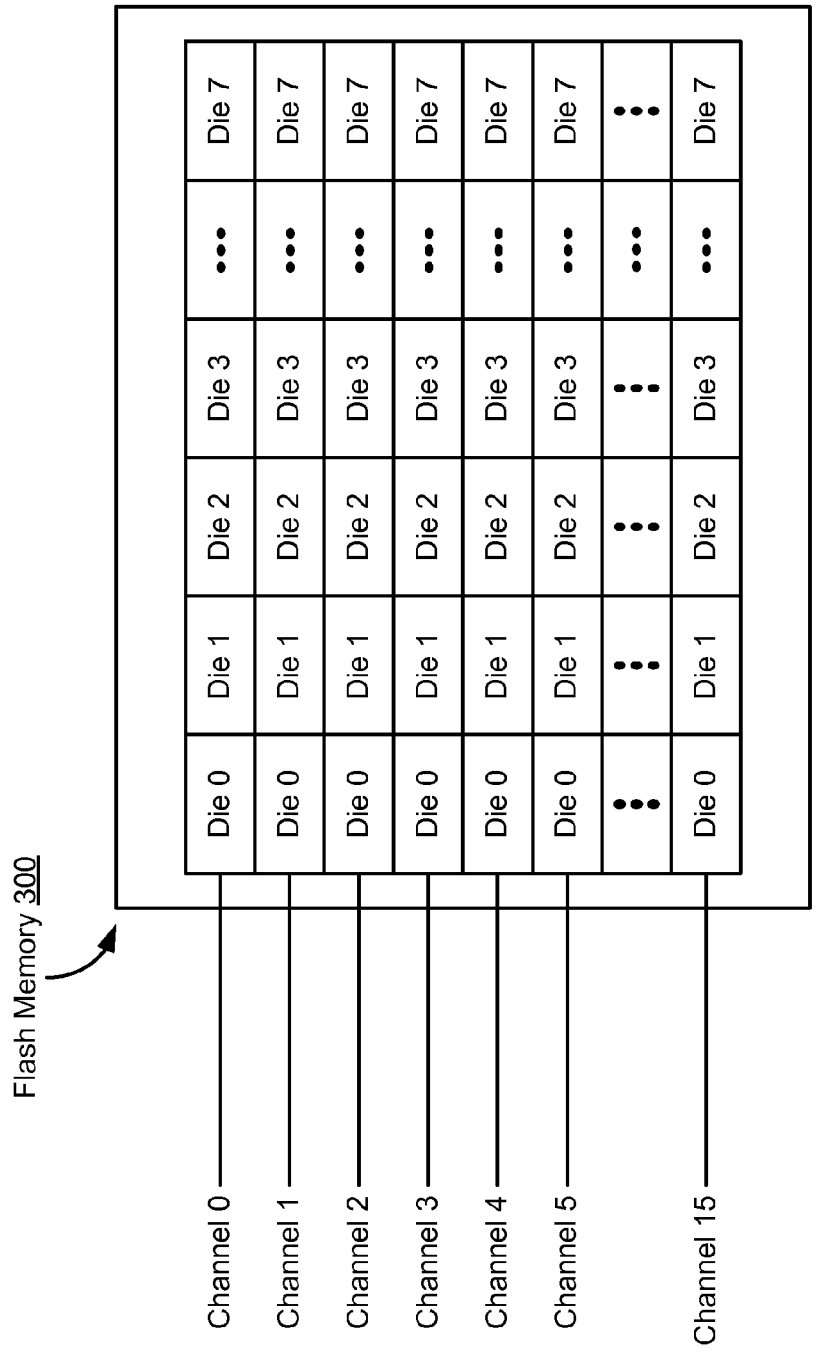
FIG. 3 is a schematic diagram of non-volatile memory in accordance with some embodiments.

FIG. 3 is a schematic diagram of non-volatile memory (e.g., flash memory) in accordance with some embodiments. In some embodiments, storage controller 120 is communicatively coupled to storage medium 130 (e.g., flash memory comprising one or more flash memory devices each comprising a plurality of die) via a set of channels (e.g., connections 103, FIG. 1). In FIG. 3, 16 channels communicatively couple flash memory 300 (e.g., a flash memory device with 128 die) to storage controller 120. In FIG. 3, a subset of the plurality of die (e.g., 8 die) of flash memory 300 are connected to each channel. In this way, storage controller 120 is configured to perform memory operations on 16 die in parallel by utilizing the 16 channels. In some embodiments, the die are physically soldered to a channel and each die is connected to only one channel.

FIG. 4 is a block diagram of a plurality of die groups in accordance with some embodiments. As was the case in FIG. 3, in FIG. 4, non-volatile memory (e.g., flash memory) comprises a plurality of die (e.g., 128 die) and the plurality of die are divided into subsets (e.g., 8 die per subset), where each subset of die is connected to a channel (e.g., one of 16 channels).

For example, prior to ordinary operational use, a calibration routine is run on a representative block from each die of flash memory, which simulates end of life conditions. For example, the BER for data read from a representative block of the respective die measured after a predefined number of PE cycles are performed on the representative block is the endurance metric. In another example, the total number of PE cycles performed on the representative block of the respective die when the BER for data read from the representative block meets or exceeds a predefined threshold is the endurance metric. In some embodiments, the endurance metric (e.g., a BER or number of PE cycles) for a respective die is stored in endurance metric field 242 of characterization vector 236 associated with the respective die.

In some embodiments, storage controller 120 or a component thereof (e.g., endurance metric module 214, FIG. 2A) is configured to obtain an endurance metric for each die from characterization vector table 234, and storage controller 120 or a component thereof (e.g., ranking module 216, FIG. 2A) is configured to rank the die in each channel based on their corresponding endurance metrics. In FIG. 4, the 8 die in channel 0 are ranked from highest to lowest. With respect to channel 0, die 3 is the highest ranked die (e.g., rank 1) because the endurance metric associated with die 3 is higher than the other die in channel 0. With respect to channel 0, die 6 is the lowest ranked die (e.g., rank 8) because the endurance metric associated with die 6 is lower than the other die in channel 0.

In some embodiments, storage controller 120 or a component thereof (e.g., grouping module 218, FIG. 2A) is configured to group the plurality of die in the flash memory device into die groups based on their corresponding rankings. In some embodiments, one or more die in each channel is assigned to a die group, where the die assigned to a respective die group have a rank, or range of ranks, corresponding to the respective die group, and each die group has a distinct corresponding rank or range of ranks. In FIG. 4, the die in each channel with ranks 1-2 (e.g., die 3 and 7 in channel 0, and die 6 and 0 in channel 15) are assigned to die group 0, the die in each channel with ranks 3-4 (e.g., die 0 and 1 in channel 0, and die 3 and 7 in channel 15) are assigned to die group 1, the die in each channel with ranks 5-6 (e.g., die 5 and 4 in channel 0, and die 5 and 2 in channel 15) are assigned to die group 2, and the die in each channel with ranks 7-8 (e.g., die 2 and 6 in channel 0, and die 4 and 1 in channel 1) are assigned to die group 3.

In some embodiments, a plurality of channels (e.g., 16 channels) communicatively couples the storage controller to the flash memory and each of the plurality of channels is communicatively coupled with a respective subset of the plurality of die (e.g., 8 or 16 die per channel). In some implementations, the die assigned to any particular die group include unequal numbers of die from the various channels. For example, if one channel (e.g., a first channel) has a greater number of die in the endurance metric range of corresponding to a particular die group than another channel (e.g., a second channel), the particular die group will include a greater number of die from the first channel than from the second channel.

Furthermore, the number of die from a respective channel that are assigned to a respective die group varies based on the endurance metric of the die in the respective channel. For example, zero die in a respective channel are assigned to a die group because the endurance metrics of the die in the respective channel do not meet the range of endurance metrics associated with the respective die group. In another example, all die in a respective channel are assigned to a single die group based on their respective endurance metrics because the endurance metrics of the die in the respective channel all meet the range of endurance metrics associated with the respective die group.

Figure 5:
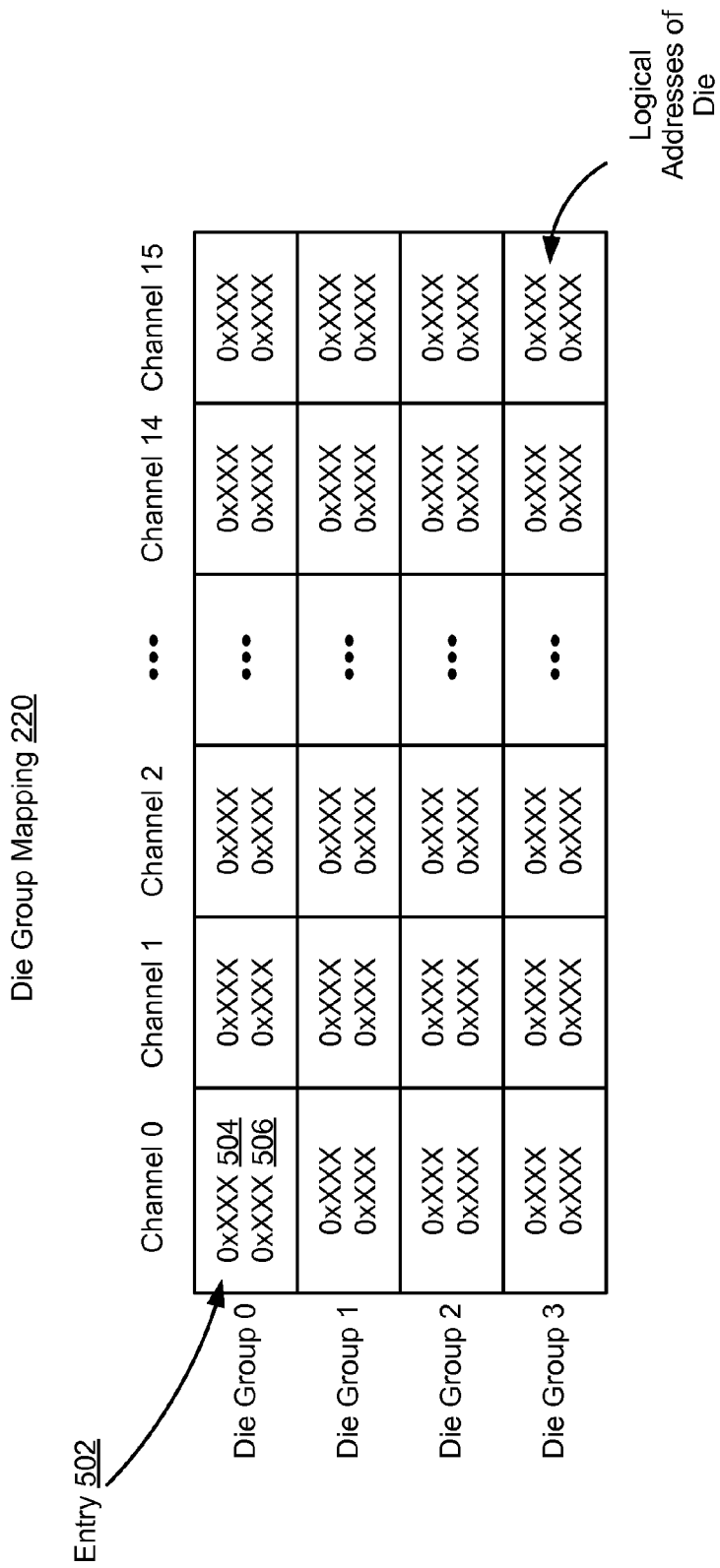
FIG. 5 is a block diagram of a die group mapping in accordance with some embodiments.

FIG. 5 is a diagram of a die group mapping corresponding to the plurality of die groups in FIG. 4 in accordance with some embodiments. In some embodiments, die group mapping 220 is stored in storage controller memory and includes the logical address (or range of logical addresses, or a representation thereof) for die assigned to each die group. In FIG. 5, die group mapping 220 associates the logical address (or range of logical addresses) for all die in channels 0-15 with their assigned die groups. In FIG. 5, the logical addresses for die 3 and 7 in channel 0 (e.g., logical addresses 504 and 506, respectively) are included in entry 502 associated with die group 0.

Figure 6A:
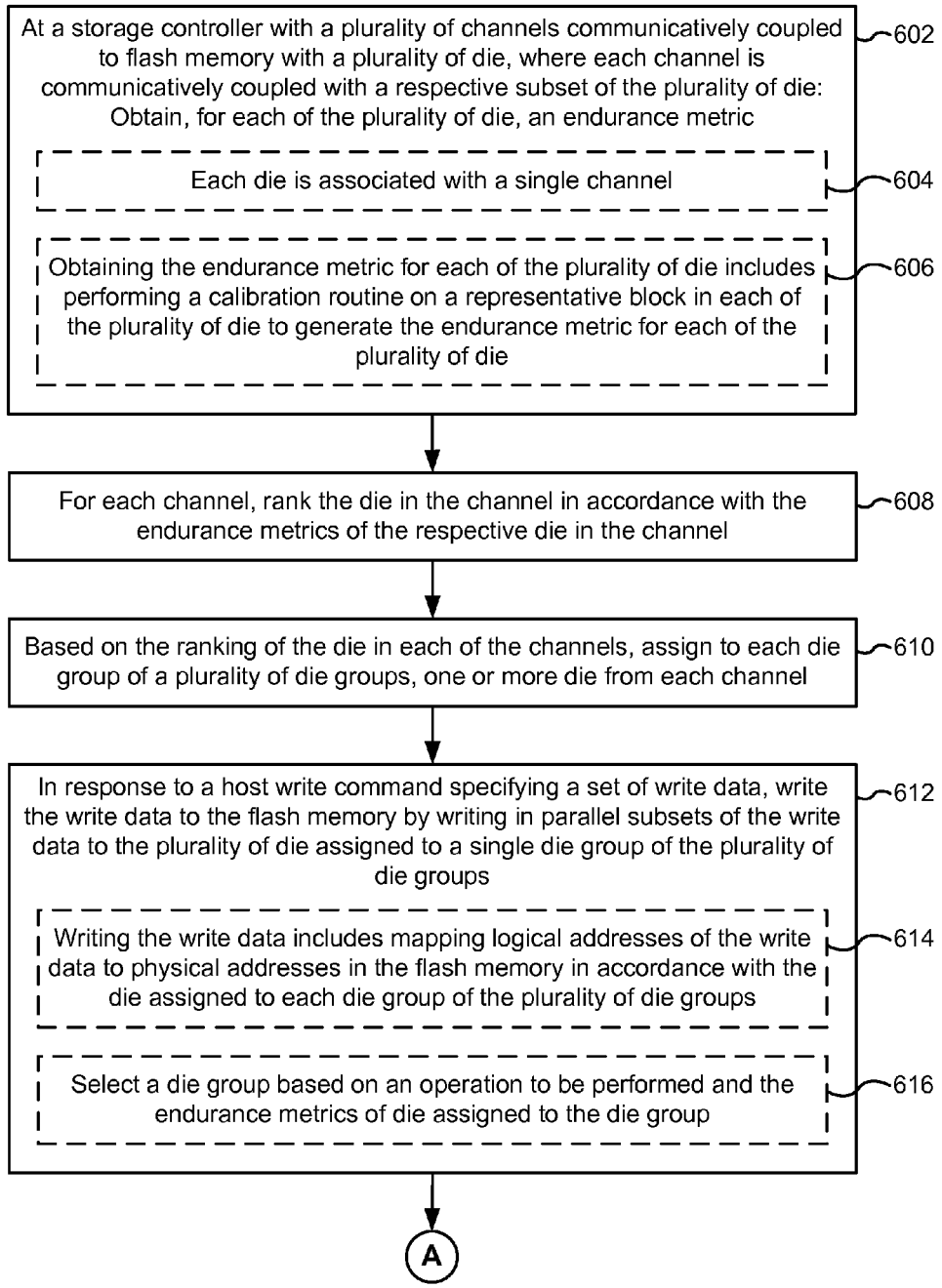
FIGS. 6A-6B illustrate a flowchart representation of a method of managing a storage system in accordance with some embodiments.
Figure 6B:
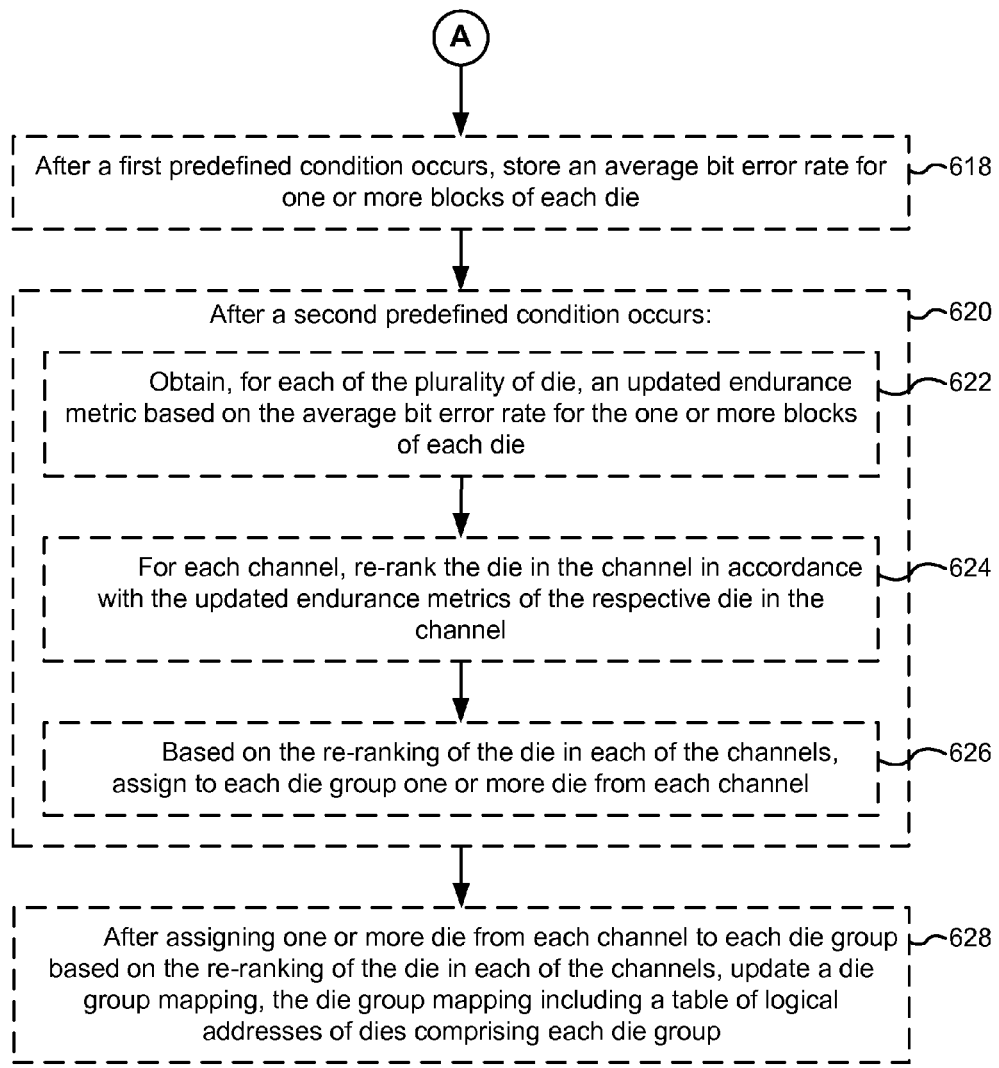

FIGS. 6A-6B illustrate a flowchart representation of a method 600 of managing a storage system that comprises a storage controller and non-volatile memory (e.g., flash memory), the non-volatile memory comprising one or more non-volatile memory devices each comprising a plurality of die and each die comprising a plurality of blocks (sometimes also called subunits). In some embodiments, method 600 is performed by storage controller 120 in FIG. 1, where a plurality of channels (e.g., 16 channels) communicatively couple storage controller 120 to the flash memory. In some embodiments, each channel is communicatively coupled with a respective subset of the plurality of die (e.g., 8 or 16 die per channel).

In some embodiments, method 600 is performed by storage controller 120 or one or more components of storage controller 120 (e.g., management module 121, FIGS. 1 and 2A). In some embodiments, method 600 is governed by instructions that are stored in a non-transitory computer readable storage medium and the instructions are executed by one or more processors of storage controller 120, such as one or more processing units (CPUs) 122 of management module 121.

The storage controller obtains (602) an endurance metric (e.g., a BER or number of PE cycles) for each of the plurality of die. In some embodiments, the endurance metric is any information indicating an estimated longevity or lifespan for a respective die. In some embodiments, the endurance metrics are based on the results of a calibration routine performed on a representative die from each die prior to ordinary operations (e.g., during initialization or at the factory). In some embodiments, the endurance metrics are based on real data (e.g., an average BER of blocks within each die) after a period of ordinary operations. In some embodiments, the endurance metric for a respective die is based on an amount of time required to erase data from the respective die (e.g., the erase time increases as the respective die ages). In some embodiments, the endurance metric for a respective die is based on a length of time or number of processing cycles required to successfully decode a codeword stored in the respective die (e.g., a number of iterations or cycles required to decode a low-density parity check code (LDPC) encoded codeword). Storage controller 120 or a component thereof (e.g., endurance metric module 214, FIG. 2A) is configured to obtain the endurance metric for a respective die from a characteristic vector 236 associated with the respective die that is stored in characterization vector table 234.

In some embodiments, each die is associated with (604) a single channel. For example, each of the plurality of die comprising the flash memory is physically connected with or soldered to a single channel.

In some embodiments, obtaining the endurance metric for each of the plurality of die includes performing (606) a calibration routine on a representative block in each of the plurality of die to generate the endurance metric (e.g., a BER or number of PE cycles) for each of the plurality of die. For example, prior to ordinary operational use (e.g., during initialization or at the factory), a calibration routine is performed on a representative block from each die of the flash memory to simulate end of life conditions. In some embodiments, the BER for data read from a representative block of the respective die measured after a predefined number of PE cycles are performed on the representative block is the endurance metric. In some embodiments, the total number of PE cycles performed on the representative block of the respective die when the BER for data read from the representative block meets or exceeds a predefined threshold is the endurance metric. In some embodiments, the endurance metric for the respective die is stored in endurance metric field 242 of characterization vector 236 associated with the respective die.

For each channel, the storage controller ranks (608) the die in the channel in accordance with the endurance metrics of the respective die in the channel. In some embodiments, storage controller 120 or a component thereof (e.g., ranking module 216, FIG. 2A) is configured to rank the die in each channel based on the endurance metrics of the die in the channel. In FIG. 4, for example, the 8 die in channel 0 are ranked from highest to lowest. With respect to channel 0, die 3 is the highest ranked die (e.g., rank 1) because the endurance metric associated with die 3 is higher than the other die in channel 0. With respect to channel 0, die 6 is the lowest ranked die (e.g., rank 8) because the endurance metric associated with die 6 is lower than the other die in channel 0.

The storage controller assigns (610) to each die group (sometimes also called a "super device") of a plurality of die groups, one or more die from each channel (e.g., one or two die per channel are typically assigned to a die group) based on the ranking of the die in each of the channels, where the die assigned to a respective die group have a rank, or range of ranks, corresponding to the respective die group, and each die group has a distinct corresponding rank or range of ranks. In some embodiments, storage controller 120 or a component thereof (e.g., grouping module 218, FIG. 2A) is configured to group the plurality of die in the flash memory into die groups based on their corresponding rankings. In some embodiments, one or more die in each channel is assigned to a die group. In some embodiments, the number of die assigned to a first die group of the plurality of die groups is unequal to the number of die assigned to a second die group of the plurality of die groups. In FIG. 4, for example, the die in each channel with ranks 1-2 (e.g., die 3 and 7 in channel 0, and die 6 and 0 in channel 15) are assigned to die group 0, the die in each channel with ranks 3-4 (e.g., die 0 and 1 in channel 0, and die 3 and 7 in channel 15) are assigned to die group 1, the die in each channel with ranks 5-6 (e.g., die 5 and 4 in channel 0, and die 5 and 2 in channel 15) are assigned to die group 2, and the die in each channel with ranks 7-8 (e.g., die 2 and 6 in channel 0, and die 4 and 1 in channel 15) are assigned to die group 3. In some embodiments, storage controller 120 or a component thereof (e.g., grouping module 218, FIG. 2A) is also configured to store the logical address (or range of logical addresses, or a representation thereof) for die assigned to each die group in die group mapping 220.

In response to a write command specifying a set of write data, the storage controller writes (612) the write data to the flash memory by writing in parallel subsets of the write data to the plurality of die assigned to a single die group of the plurality of die groups. For example, with reference to FIG. 1, storage controller 120 receives a host write command via control line 111 and a set of write data via data connections 101 from computer system 110 (e.g., a host). In response to the host write command, storage controller 120 or a component thereof (e.g., data write module 208, FIG. 2A) is configured to write data to the flash memory by writing, in parallel, subsets of the write data to the plurality of die assigned to a single die group of the plurality of die groups. For example, with respect to FIG. 4, the write data is striped across the die comprising the single die group (e.g., die group 0) by concurrently writing subsets of the write data to each of the 16 rank 1 die in die group 0, in parallel, using the 16 channels.

In some embodiments, writing the write data includes mapping (614) logical addresses of the write data to physical addresses in the flash memory in accordance with the die assigned to each die group of the plurality of die groups. In some embodiments, storage controller or a component thereof maps the logical address (or range of logical addresses) of the write data to physical addresses in the flash memory in logical to physical mapping 238. In some embodiments, logical to physical mapping 238 is stored at storage controller 120 or remote from storage controller 120.

In some embodiments, the storage controller selects (616) a die group based on an operation to be performed and the endurance metrics of die assigned to the die group. In some embodiments, storage controller 120 or a component thereof (e.g., selection module 222, FIG. 2A) is configured to select a die group of the plurality of die groups based on the operation to be performed (e.g., host write or garbage collection operation) and the endurance metrics of die assigned to the die group. For example, selection module 222 selects a die group comprising highly ranked die for write operations. In another example, selection module 222 selects a die group comprising lower ranked die for garbage collection/recycling operations.

In some embodiments, after a first predefined condition occurs, the storage controller stores (618) an average bit error rate for one or more blocks (e.g., a group of blocks or "superblock") of each die. In some embodiments, in response to detecting the first predefined condition, storage controller 120 or a component thereof is configured to sample the current BER for one or more blocks of each die, average the BERs of the one or more blocks of each die, and store current the average BER for each die. In some embodiments, the current the average BER of a respective die is stored in average BER field 246 of characterization vector 236 associated with the respective die. In some embodiments, the first predefined condition is a periodic trigger (e.g., every X hours or every N PE cycles performed on the respective die) or an event (e.g., shutdown, power loss, etc.).

In some embodiments, after a second predefined condition occurs (620), the storage controller obtains (622), for each of the plurality of die, an updated endurance metric. In some embodiments, storage controller 120 or a component thereof (e.g., endurance metric module 214, FIG. 2A) is configured to store an updated endurance metric for each of the plurality of die. In some embodiments, the updated endurance metric is based on the average bit error rate for the one or more blocks of each die, which was stored in response to detecting the first predefined condition. In some embodiments, the updated endurance metric is based on an erase time associated with the die or the amount of time required to successfully decode a codeword stored in the die. In some embodiments, the updated endurance metric for a respective die is stored in endurance metric field 242 of characterization vector 236 associated with the respective die and replaces the previous value stored in endurance metric field 242. In some embodiments, the second predefined condition is a periodic trigger (e.g., every Y days, every M PE cycles performed on the respective die, etc.).

In some embodiments, after the second predefined condition occurs (620), the storage controller re-ranks (624), for each channel, the die in the channel in accordance with the updated endurance metrics of the respective die in the channel. In some embodiments, storage controller 120 or a component thereof (e.g., ranking module 216, FIG. 2A) is configured to re-rank the die in each channel based on updated endurance metric associated with each die in the channel.

In some embodiments, after the second predefined condition occurs (620), the storage controller assigns (626) to each die group one or more die from each channel based on the re-ranking of the die in each of the channels. In some embodiments, storage controller 120 or a component thereof (e.g., grouping module 218, FIG. 2A) is configured to group the plurality of die in the flash memory into die groups based on their corresponding re-rankings.

In some embodiments, after assigning one or more die from each channel to each die group based on the re-ranking of the die in each of the channels, the storage controller updates (628) a die group mapping, the die group mapping includes a table of logical addresses of die comprising each die group. In some embodiments, after assigning one or more die from each channel to each die group based on the re-ranking of the die in each of the channels, storage controller 120 or a component thereof (e.g., grouping module 218, FIG. 2A) is configured to update die group mapping 220 to reflect the logical address (or range of logical addresses, or a representation thereof) for die assigned to each die group based on the re-ranking.

Figure 7:
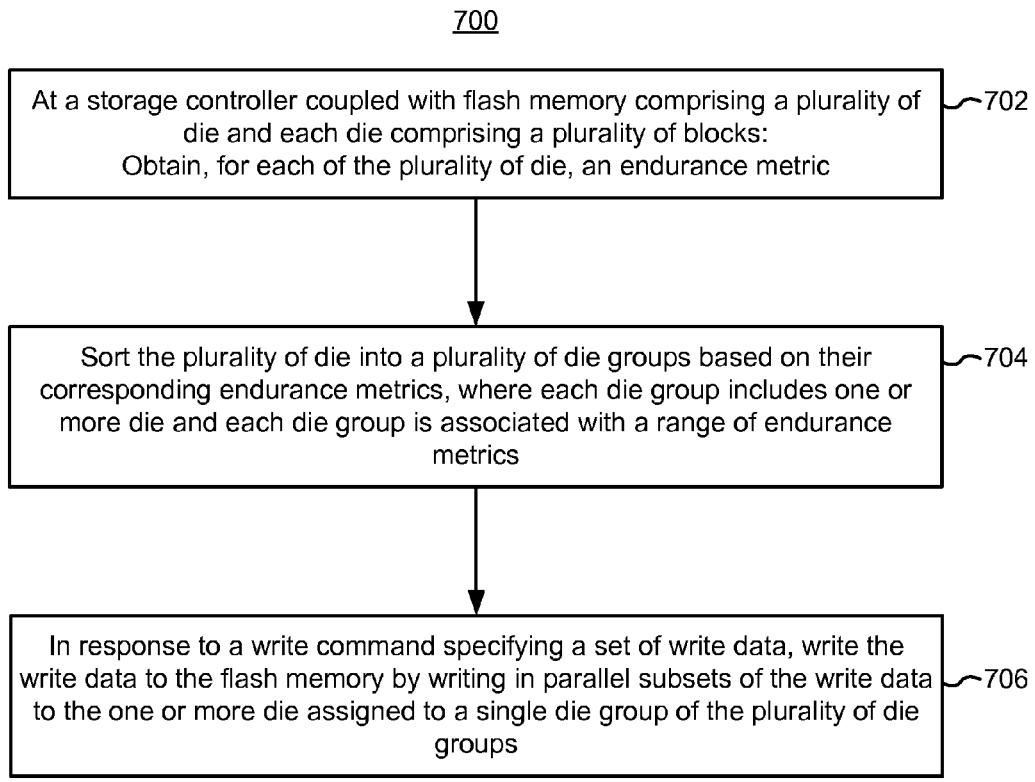
FIG. 7 illustrates a flowchart representation of a method of managing a storage system in accordance with some embodiments.

FIG. 7 illustrates a flowchart representation of a method 700 of managing a storage system that comprises a storage controller and non-volatile memory (e.g., flash memory), the non-volatile memory comprising one or more non-volatile memory devices each comprising a plurality of die and each die comprising a plurality of blocks (sometimes also called subunits). In some embodiments, method 700 is performed by storage controller 120 or one or more components of storage controller 120 (e.g., management module 121, FIGS. 1 and 2A). In some embodiments, method 700 is governed by instructions that are stored in a non-transitory computer readable storage medium and the instructions are executed by one or more processors of storage controller 120, such as one or more processing units (CPUs) 122 of management module 121.

The storage controller obtains (702) an endurance metric (e.g., a BER or number of PE cycles) for each of the plurality of die. In some embodiments, the endurance metric is any information indicating an estimated longevity or lifespan for a respective die. In some embodiments, the BER for data read from a representative block of the respective die measured after a predefined number of PE cycles are performed on the representative block is the endurance metric. In some embodiments, the total number of PE cycles performed on the representative block of the respective die when the BER for data read from the representative block meets or exceeds a predefined threshold is the endurance metric. In some embodiments, the endurance metric for a respective die is based on an amount of time required to erase data from the respective die (e.g., the erase time increases as the respective die ages). In some embodiments, the endurance metric for a respective die is based on a length of time or number of processing cycles required to successfully decode a codeword stored in the respective die (e.g., a number of iterations or cycles required to decode a low-density parity check code (LDPC) encoded codeword). Storage controller 120 or a component thereof (e.g., endurance metric module 214, FIG. 2A) is configured to obtain the endurance metric for a respective die from a characteristic vector 236 associated with the respective die that is stored in characterization vector table 234.

The storage controller sorts (704) the plurality of die into a plurality of die groups based on their corresponding endurance metrics, where each die group includes one or more die and each die group is associated with a range of endurance metrics. For example, die with substantially similar endurance metrics are assigned to a same die group. As such, when memory operations are performed on the die of a particular die group, the die in the particular die group will decay at a substantially similar rate. In some embodiments, the number of die assigned to a first die group of the plurality of die groups is unequal to the number of die assigned to a second die group of the plurality of die groups.

In some embodiments, a plurality of channels (e.g., 16 channels) communicatively couples the storage controller to the flash memory and each of the plurality of channels is communicatively coupled with a respective subset of the plurality of die (e.g., 8 or 16 die per channel). In some implementations, the die assigned to any particular die group include unequal numbers of die from the various channels. For example, if one channel (e.g., a first channel) has a greater number of die in the endurance metric range of corresponding to a particular die group than another channel (e.g., a second channel), the particular die group will include a greater number of die from the first channel than from the second channel.

Furthermore, the number of die from a respective channel that are assigned to a respective die group varies based on the endurance metric of the die in the respective channel. For example, zero die in a respective channel are assigned to a die group because the endurance metrics of the die in the respective channel do not meet the range of endurance metrics associated with the respective die group. In another example, all die in a respective channel are assigned to a single die group based on their respective endurance metrics because the endurance metrics of the die in the respective channel all meet the range of endurance metrics associated with the respective die group.

In response to a write command specifying a set of write data, the storage controller writes (706) the write data to the flash memory by writing in parallel subsets of the write data to the plurality of die assigned to a single die group of the plurality of die groups. For example, storage controller 120 receives a host write command via control line 111 and a set of write data via data connections 101 from computer system 110 (e.g., a host). In response to the host write command, storage controller 120 or a component thereof (e.g., data write module 208, FIG. 2A) is configured to write data to the flash memory by writing (e.g., in parallel when possible) subsets of the write data to the plurality of die assigned to a single die group of the plurality of die groups.

In some embodiments, after a predefined condition occurs, the storage controller obtains, for each of the plurality of die, an updated endurance metric. In some embodiments, storage controller 120 or a component thereof (e.g., endurance metric module 214, FIG. 2A) is configured to store an updated endurance metric for each of the plurality of die. In some embodiments, the updated endurance metric for a respective die is stored in endurance metric field 242 of characterization vector 236 associated with the respective die and replaces the previous value stored in endurance metric field 242. In some embodiments, the second predefined condition is a periodic trigger (e.g., every Y days, every M PE cycles performed on the respective die, etc.).

In some embodiments, after the predefined condition occurs, the storage controller re-sorts the plurality of die into a plurality of updated die groups based on their corresponding updated endurance metrics, where each updated die group includes one or more die and each updated die group is associated with a range of endurance metrics.

In some embodiments, after re-sorting the plurality of die into a plurality of updated die groups based on their corresponding updated endurance metrics, the storage controller updates a die group mapping, where the die group mapping includes a table of logical addresses of die comprising each die group.

It will be understood that, although the terms "first," "second," etc. may be used herein to describe various elements, these elements should not be limited by these terms. These terms are only used to distinguish one element from another. For example, a first die group could be termed a second die group, and, similarly, a second die group could be termed a first die group, which changing the meaning of the description, so long as all occurrences of the "first die group" are renamed consistently and all occurrences of the "second die group" are renamed consistently. The first die group and the second die group are both die groups, but they are not the same die group.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of managing a storage system that comprises a storage controller and non-volatile memory, the non-volatile memory comprising a plurality of die and each die comprising a plurality of subunits, the method comprising:
 at the storage controller coupled with the non-volatile memory:
  for each of the plurality of die, obtaining an endurance metric;
  sorting the plurality of die into a plurality of die groups based on their corresponding endurance metrics, wherein each die group includes one or more die and each die group is associated with a corresponding range of endurance metrics, and wherein a plurality of the die groups each includes two or more die;
  storing a die group mapping in the storage controller that indicates which die are assigned to each die group of the plurality of die groups, wherein the storage controller includes a logical address to physical address mapping distinct from the die group mapping; and
  in response to a write command specifying a set of write data, writing the set of write data to the non-volatile memory by writing in parallel distinct respective subsets of the set of write data to distinct respective die assigned to a single die group of the plurality of die groups.

2. The method of claim 1, wherein obtaining the endurance metric for each of the plurality of die includes performing a calibration routine on a representative subunit in each of the plurality of die to generate the endurance metric for each of the plurality of die.

3. The method of claim 1, wherein the plurality of die groups includes at least four die groups, and writing the write data includes mapping, in the logical address to physical address mapping, logical addresses of the write data to physical addresses in the non-volatile memory in accordance with the die group mapping in the storage controller that indicates which die are assigned to each die group of the plurality of die groups.

4. The method of claim 1, further comprising:
 selecting a die group based on an operation to be performed and the endurance metrics of die assigned to the die group.

5. The method of claim 1, further comprising:
 after a predefined condition occurs:
  obtaining, for each of the plurality of die, an updated endurance metric; and
  re-sorting the plurality of die into a plurality of updated die groups based on their corresponding updated endurance metrics, wherein each updated die group includes one or more die and each updated die group is associated with a corresponding range of endurance metrics.

6. The method of claim 5, further comprising:
after re-sorting the plurality of die into a plurality of updated die groups, updating the die group mapping, the die group mapping including a table of logical addresses of die comprising each die group.

7. The method of claim 1, wherein a plurality of channels communicatively couple the storage controller to the non-volatile memory, wherein each channel is communicatively coupled with a respective subset of the plurality of die, the method further comprising:
for each channel, ranking the die in the channel in accordance with the endurance metrics of the respective die in the channel; and
wherein sorting the plurality of die into a plurality of die groups based on their corresponding endurance metrics includes assigning, based on the ranking of the die in each of the channels, to each die group of a plurality of die groups, one or more die from each channel, wherein the die assigned to a respective die group have a rank, or range of ranks, corresponding to the respective die group, and each die group has a distinct corresponding rank or range of ranks.

8. The method of claim 7, further comprising:
after a predefined condition occurs:
obtaining, for each of the plurality of die, an updated endurance metric;
for each channel, re-ranking the die in the channel in accordance with the updated endurance metrics of the respective die in the channel; and
based on the re-ranking of the die in each of the channels, assigning to each die group one or more die from each channel.

9. The method of claim 8, further comprising:
after assigning one or more die from each channel to each die group based on the re-ranking of the die in each of the channels, updating the die group mapping, the die group mapping including a table of logical addresses of die comprising each die group.

10. A storage controller, comprising:
one or more processors;
a host interface configured to couple the storage controller to a host;
a storage medium interface configured to couple the storage controller to non-volatile memory comprising a plurality of die, each die comprising a plurality of subunits; and
a storage controller memory storing instructions, which, when executed by the one or more processors, cause the storage controller to perform operations comprising:
for each of the plurality of die, obtaining an endurance metric;
sorting the plurality of die into a plurality of die groups based on their corresponding endurance metrics, wherein each die group includes one or more die and each die group is associated with a corresponding range of endurance metrics, and wherein a plurality of the die groups each includes two or more die;
storing a die group mapping in the storage controller that indicates which die are assigned to each die group of the plurality of die groups, wherein the storage controller includes a logical address to physical address mapping distinct from the die group mapping; and
in response to a write command specifying a set of write data, writing the set of write data to the non-volatile memory by writing in parallel distinct respective subsets of the set of write data to distinct respective die assigned to a single die group of the plurality of die groups.

11. The storage controller of claim 10, wherein obtaining the endurance metric for each of the plurality of die includes performing a calibration routine on a representative subunit in each of the plurality of die to generate the endurance metric for each of the plurality of die.

12. The storage controller of claim 10, wherein the plurality of die groups includes at least four die groups, and writing the write data includes mapping, in the logical address to physical address mapping, logical addresses of the write data to physical addresses in the non-volatile memory in accordance with the die group mapping in the storage controller that indicates which die are assigned to each die group of the plurality of die groups.

13. The storage controller of claim 10, wherein the instructions cause the storage controller to perform operations further comprising:
selecting a die group based on an operation to be performed and the endurance metrics of die assigned to the die group.

14. The storage controller of claim 10, wherein the instructions cause the storage controller to perform operations further comprising:
after a predefined condition occurs:
obtaining, for each of the plurality of die, an updated endurance metric; and
re-sorting the plurality of die into a plurality of updated die groups based on their corresponding updated endurance metrics, wherein each updated die group includes one or more die and each updated die group is associated with a corresponding range of endurance metrics.

15. The storage controller of claim 14, wherein the instructions cause the storage controller to perform operations further comprising:
after re-sorting the plurality of die into a plurality of updated die groups, updating the die group mapping, the die group mapping including a table of logical addresses of die comprising each die group.

16. The storage controller of claim 10, wherein:
a plurality of channels communicatively couple the storage controller to the non-volatile memory, wherein each channel is communicatively coupled with a respective subset of the plurality of die; and
the instructions cause the storage controller to perform operations further comprising:
for each channel, ranking the die in the channel in accordance with the endurance metrics of the respective die in the channel; and
wherein sorting the plurality of die into a plurality of die groups based on their corresponding endurance metrics includes assigning, based on the ranking of the die in each of the channels, to each die group of a plurality of die groups, one or more die from each channel, wherein the die assigned to a respective die group have a rank, or range of ranks, corresponding to the respective die group, and each die group has a distinct corresponding rank or range of ranks.

17. A non-transitory computer readable storage medium, storing one or more programs for execution by one or more processors of a storage controller communicatively coupled with non-volatile memory comprising a plurality of die and each die comprising a plurality of subunits, the one or more programs including instructions that when executed by the one or more processors cause the storage controller to:

for each of the plurality of die, obtain an endurance metric;

sort the plurality of die into a plurality of die groups based on their corresponding endurance metrics, wherein each die group includes one or more die and each die group is associated with a corresponding range of endurance metrics, and wherein a plurality of the die groups each includes two or more die;

storing a die group mapping in the storage controller that indicates which die are assigned to each die group of the plurality of die groups, wherein the storage controller includes a logical address to physical address mapping distinct from the die group mapping; and in response to a write command specifying a set of write data, write the set of write data to the non-volatile memory by writing in parallel distinct respective subsets of the set of write data to distinct respective die assigned to a single die group of the plurality of die groups.

18. The non-transitory computer readable storage medium of claim 17, wherein obtaining the endurance metric for each of the plurality of die includes performing a calibration routine on a representative subunit in each of the plurality of die to generate the endurance metric for each of the plurality of die.

19. The non-transitory computer readable storage medium of claim 17, wherein the plurality of die groups includes at least four die groups, and writing the write data includes mapping, in the logical address to physical address mapping, logical addresses of the write data to physical addresses in the non-volatile memory in accordance with the die group mapping in the storage controller that indicates which die are assigned to each die group of the plurality of die groups.

20. The non-transitory computer readable storage medium of claim 17, wherein the one or more programs further include instructions that when executed by the one or more processors cause the storage controller to:

select a die group based on an operation to be performed and the endurance metrics of die assigned to the die group.

21. The non-transitory computer readable storage medium of claim 17, wherein the one or more programs further include instructions that when executed by the one or more processors cause the storage controller to:

after a predefined condition occurs:
obtain, for each of the plurality of die, an updated endurance metric; and
re-sort the plurality of die into a plurality of updated die groups based on their corresponding updated endurance metrics, wherein each updated die group includes one or more die and each updated die group is associated with a corresponding range of endurance metrics.

22. The non-transitory computer readable storage medium of claim 21, wherein the one or more programs further include instructions that when executed by the one or more processors cause the storage controller to:

after re-sorting the plurality of die into a plurality of updated die groups, update the die group mapping, the die group mapping including a table of logical addresses of die comprising each die group.

23. The non-transitory computer readable storage medium of claim 17, wherein:

a plurality of channels communicatively couple the storage controller to the non-volatile memory, wherein each channel is communicatively coupled with a respective subset of the plurality of die; and the one or more programs further include instructions that when executed by the one or more processors cause the storage controller to:
for each channel, rank the die in the channel in accordance with the endurance metrics of the respective die in the channel; and
wherein sorting the plurality of die into a plurality of die groups based on their corresponding endurance metrics includes assigning, based on the ranking of the die in each of the channels, to each die group of a plurality of die groups, one or more die from each channel, wherein the die assigned to a respective die group have a rank, or range of ranks, corresponding to the respective die group, and each die group has a distinct corresponding rank or range of ranks.

* * * * *